United States Patent
Upadhyayula et al.

(10) Patent No.: US 10,325,881 B2
(45) Date of Patent: Jun. 18, 2019

(54) VERTICAL SEMICONDUCTOR DEVICE HAVING A STACKED DIE BLOCK

(71) Applicant: SANDISK INFORMATION TECHNOLOGY (SHANGAHAI) CO. LTD., Shanghai (CN)

(72) Inventors: Suresh Upadhyayula, San Jose, CA (US); Ning Ye, San Jose, CA (US); Chin Tien Chiu, Taichung (TW); Hem Takiar, Fremont, CA (US); Peng Chen, Fremont, CA (US)

(73) Assignee: SanDisk Information Technology (Shanghai) Co., Ltd., Shanghai (CN)

( * ) Notice: Subject to any disclaimer, the term of this patent is extended or adjusted under 35 U.S.C. 154(b) by 0 days.

(21) Appl. No.: 15/620,331

(22) Filed: Jun. 12, 2017

(65) Prior Publication Data

US 2018/0047706 A1    Feb. 15, 2018

(30) Foreign Application Priority Data

Aug. 9, 2016    (CN) .......................... 2016 1 0647054

(51) Int. Cl.
*H01L 25/04*    (2014.01)
*H01L 25/07*    (2006.01)
(Continued)

(52) U.S. Cl.
CPC .... *H01L 25/0657* (2013.01); *H01L 23/49816* (2013.01); *H01L 24/06* (2013.01); (Continued)

(58) Field of Classification Search
CPC . H01L 25/0657; H01L 25/042; H01L 25/072; H01L 25/0753; H01L 23/49816;
(Continued)

(56) References Cited

U.S. PATENT DOCUMENTS 4,575,762 A * 3/1986 Andrews, II .......... H01L 25/042
                                                    250/208.1
5,031,072 A * 7/1991 Malhi ..................... H01L 23/13
                                                    257/723
(Continued)

FOREIGN PATENT DOCUMENTS

| CN | 103081102 | 5/2013 |
| CN | 103545280 | 1/2014 |
| JP | 2009065034 | 3/2009 |

OTHER PUBLICATIONS

English language Abstract for JP2009065034 published Mar. 26, 2009.

(Continued)

*Primary Examiner* — Ida M Soward
(74) *Attorney, Agent, or Firm* — Vierra Magen Marcus LLP

(57) ABSTRACT

A semiconductor device vertically mounted on a medium such as a printed circuit board, and a method of its manufacture, are disclosed. The semiconductor device includes a stack of semiconductor die having contact pads which extend to an active edge of the die aligned on one side of the stack. The active edges of the die are affixed to the PCB and the contact pads at the active edge are electrically coupled to the PCB. This configuration provides an optimal, high density arrangement of semiconductor die in the device, where a large number of semiconductor die can be mounted and electrically coupled directly to the PCT, without a substrate, without staggering the semiconductor die, and without using wire bonds.

15 Claims, 9 Drawing Sheets

(51) Int. Cl.
*H01L 25/11* (2006.01)
*H01L 23/49* (2006.01)
*H01L 25/065* (2006.01)
*H01L 23/498* (2006.01)
*H01L 23/00* (2006.01)
H01L 25/075 (2006.01)
H01L 21/304 (2006.01)
H01L 21/56 (2006.01)
H01L 21/78 (2006.01)
H01L 25/00 (2006.01)

(52) U.S. Cl.
CPC ............ *H01L 24/32* (2013.01); *H01L 21/304* (2013.01); *H01L 21/563* (2013.01); *H01L 21/78* (2013.01); *H01L 24/11* (2013.01); *H01L 24/27* (2013.01); *H01L 24/81* (2013.01); *H01L 24/94* (2013.01); *H01L 25/042* (2013.01); *H01L 25/043* (2013.01); *H01L 25/072* (2013.01); *H01L 25/074* (2013.01); *H01L 25/0753* (2013.01); *H01L 25/0756* (2013.01); *H01L 25/117* (2013.01); *H01L 25/50* (2013.01); *H01L 2224/05013* (2013.01); *H01L 2224/05144* (2013.01); *H01L 2224/05147* (2013.01); *H01L 2224/05155* (2013.01); *H01L 2224/05166* (2013.01); *H01L 2224/06179* (2013.01); *H01L 2224/08168* (2013.01); *H01L 2224/32145* (2013.01); *H01L 2224/81192* (2013.01); *H01L 2224/81815* (2013.01); *H01L 2225/06517* (2013.01); *H01L 2225/06527* (2013.01); *H01L 2924/1438* (2013.01); *H01L 2924/2064* (2013.01)

(58) Field of Classification Search
CPC ....... H01L 24/06; H01L 24/32; H01L 25/043; H01L 25/074; H01L 25/0756; H01L 25/117
See application file for complete search history.

(56) References Cited

U.S. PATENT DOCUMENTS

| | | | | |
|---|---|---|---|---|
| 5,239,447 A | | 8/1993 | Cotues et al. | |
| 5,347,428 A | * | 9/1994 | Carson | H01L 25/0657 174/260 |
| 5,397,747 A | * | 3/1995 | Angiulli | H01L 25/0652 228/180.22 |
| 5,532,519 A | * | 7/1996 | Bertin | H01L 25/0657 257/686 |
| 5,719,438 A | * | 2/1998 | Beilstein, Jr. | H01L 23/49827 257/686 |
| 5,817,530 A | * | 10/1998 | Ball | H01L 25/0657 117/56 |
| 5,990,566 A | * | 11/1999 | Farnworth | H01L 23/4985 257/686 |
| 6,005,776 A | * | 12/1999 | Holman | H01L 25/0657 257/E25.013 |
| 6,156,165 A | * | 12/2000 | Pierson | H01L 23/3675 204/192.12 |
| 6,410,859 B1 | * | 6/2002 | King | H01L 25/0657 174/260 |
| 7,253,025 B2 | * | 8/2007 | Jiang | H01L 23/49575 257/783 |
| 8,203,215 B2 | | 6/2012 | Sasaki et al. | |
| 8,772,920 B2 | * | 7/2014 | Thacker | H01L 24/13 257/686 |
| 2001/0014489 A1 | * | 8/2001 | Kinsman | H01L 25/0657 438/107 |
| 2008/0303139 A1 | * | 12/2008 | Bernstein | H01L 23/585 257/723 |
| 2011/0057306 A1 | * | 3/2011 | McShane | H01L 24/13 257/706 |
| 2012/0211878 A1 | * | 8/2012 | Popovic | H01L 24/05 257/690 |
| 2014/0225284 A1 | * | 8/2014 | Thacker | H01L 23/10 257/787 |
| 2018/0040587 A1 | * | 2/2018 | Tao | H01L 25/0655 |

OTHER PUBLICATIONS

English language Abstract for CN103081102 published May 1, 2013.

English language Abstract for CN103545280 published Jan. 29, 2014.

\* cited by examiner

VERTICAL SEMICONDUCTOR DEVICE HAVING A STACKED DIE BLOCK

BACKGROUND

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones.

While many varied packaging configurations are known, flash memory storage cards may in general be fabricated as system-in-a-package (SiP) or multichip modules (MCM), where a plurality of die are mounted and interconnected on a small footprint substrate. The substrate may in general include a rigid, dielectric base having a conductive layer etched on one or both sides. Electrical connections are formed between the die and the conductive layer(s), and the conductive layer(s) provide an electric lead structure for connection of the die to a host device. Once electrical connections between the die and substrate are made, the assembly is then typically encased in a molding compound which provides a protective package.

Cross-sectional side and top views of a conventional semiconductor package 20 are shown in FIGS. 1 and 2. Typical packages include a plurality of semiconductor die, such as flash memory die 22 and a controller die 24, supported on a substrate 26. Substrate 26 includes vias, electrical traces and contact pads for transferring signals between the semiconductor die 22, 24 and a host device in which the package is located. Die bond pads 28 may be formed on a surface of the semiconductor die 22, 24 to electrically couple the semiconductor die to the substrate by affixing wire bonds 32 between respective die bond pads and contact pads. Once all electrical connections are made, the die and wire bonds may be encapsulated in a molding compound 34 to seal the package and protect the die and wire bonds.

With the ever-present drive to provide more storage capacity in a smaller package, there is a need to rethink the use of substrates and how the semiconductor die are arranged within the semiconductor package.

DETAILED DESCRIPTION

The present technology will now be described with reference to the figures, which in embodiments, relate to a semiconductor device vertically mounted on a medium such as a printed circuit board (PCB). The semiconductor device comprises a stack of semiconductor die having contact pads which extend to an active edge of the die aligned on one side of the stack. The active edges of the die are affixed to the PCB and the contact pads at the active edge are electrically coupled to the PCB. This configuration provides an optimal, high density arrangement of semiconductor die in the device, where a large number of semiconductor die can be mounted and electrically coupled directly to the PCT, without a substrate, without staggering the semiconductor die, and without using wire bonds.

It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

The terms "top" and "bottom," "upper" and "lower" and "vertical" and "horizontal," and forms thereof, as may be used herein are by way of example and illustrative purposes only, and are not meant to limit the description of the invention inasmuch as the referenced item can be exchanged in position and orientation. Also, as used herein, the terms "substantially" and/or "about" mean that the specified dimension or parameter may be varied within an acceptable manufacturing tolerance for a given application. In one embodiment, the acceptable manufacturing tolerance is ±0.25%.

Figure 1:
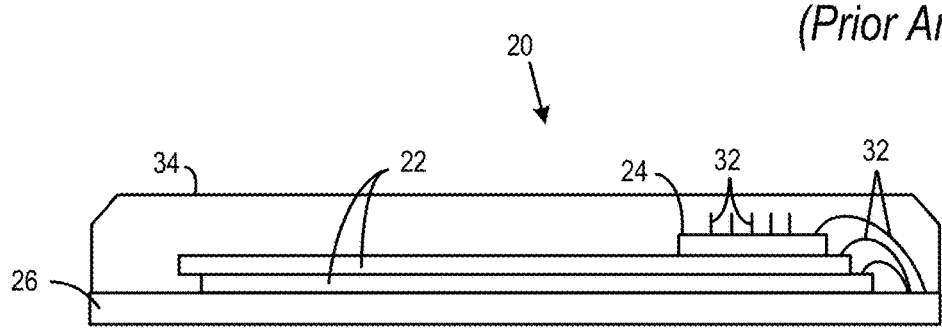
FIG. 1 is a prior art edge view of a conventional semiconductor device including semiconductor die mounted on a substrate.
Figure 2:
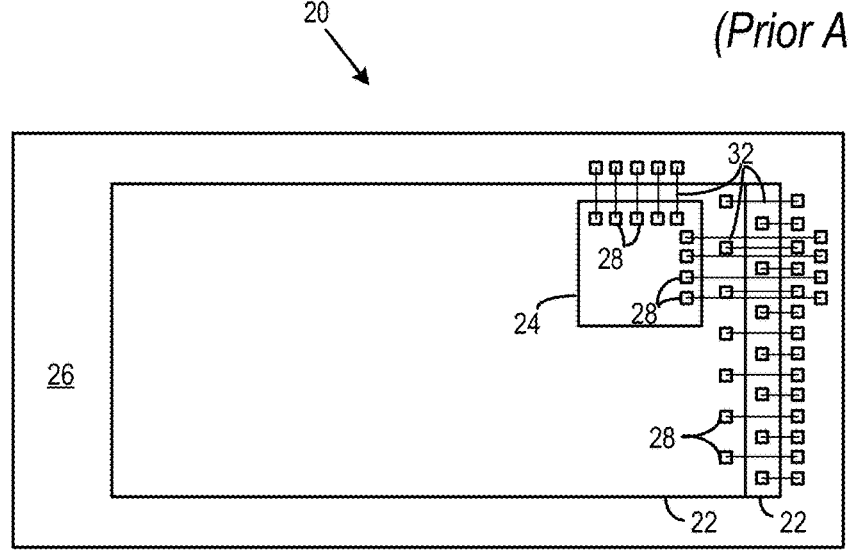
FIG. 2 is a prior art top view of a conventional semiconductor device including semiconductor die mounted on a substrate.
Figure 3:
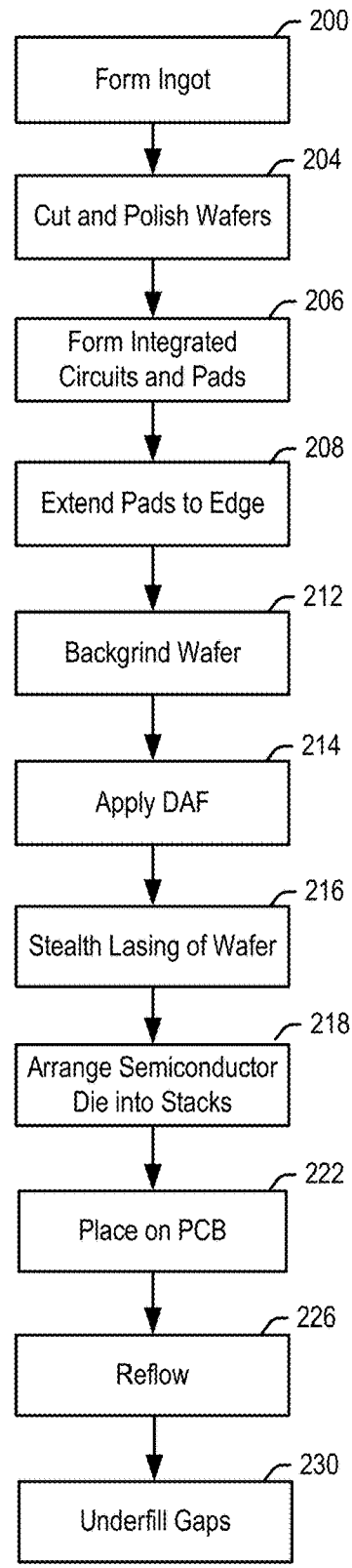
FIG. 3 is a flowchart for forming a semiconductor die according to embodiments of the present invention.

An embodiment of the present invention will now be explained with reference to the flowchart of FIG. 3, and the views of FIGS. 4-13. Referring initially to the flowchart of FIG. 3, a semiconductor wafer 100 may start as an ingot of wafer material which may be formed in step 200. In one example, the ingot from which the wafers 100 are formed may be monocrystalline silicon grown according to either a Czochralski (CZ) or floating zone (FZ) process. However, wafer 100 may be formed of other materials and by other processes in further embodiments.

Figure 4:
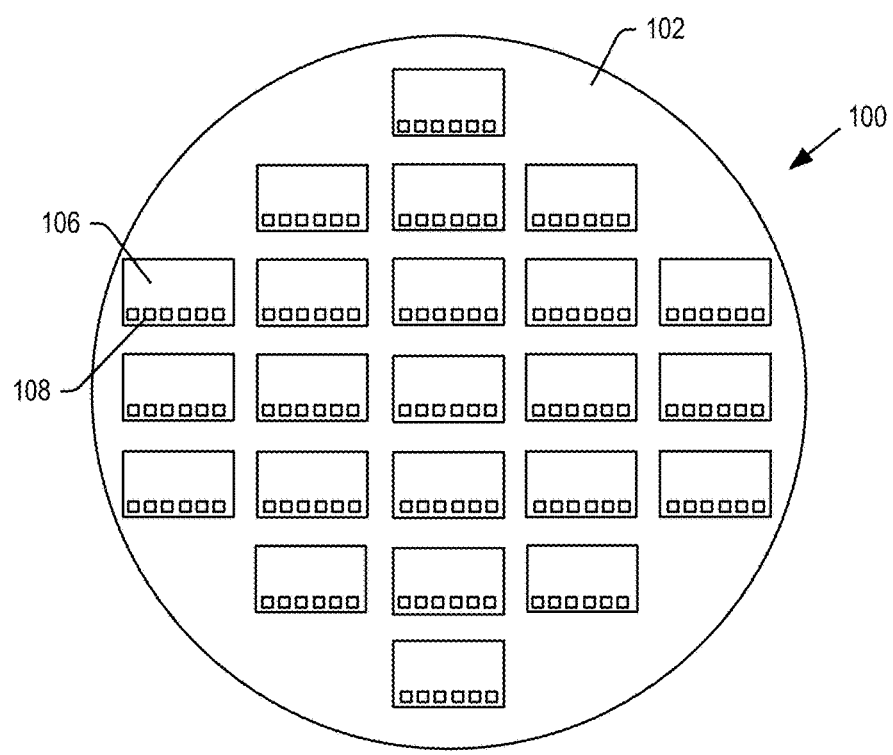
FIG. 4 is a front view of a semiconductor wafer showing a first major surface of the wafer.
Figure 5:
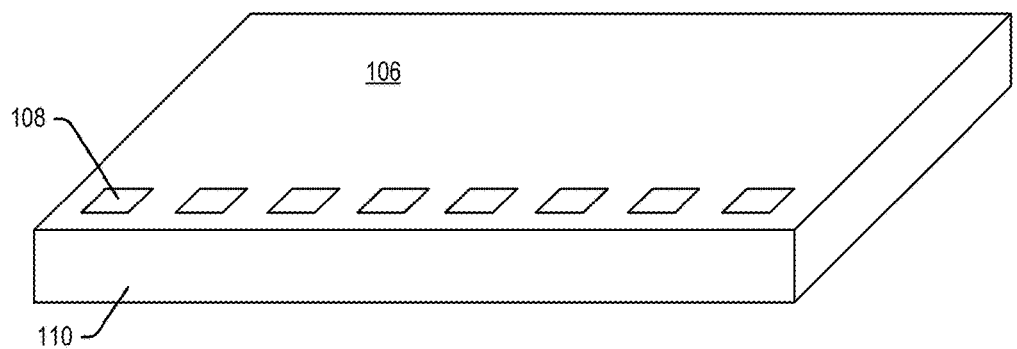
FIG. 5 is a front perspective view of a single semiconductor die from the wafer.
Figure 6:
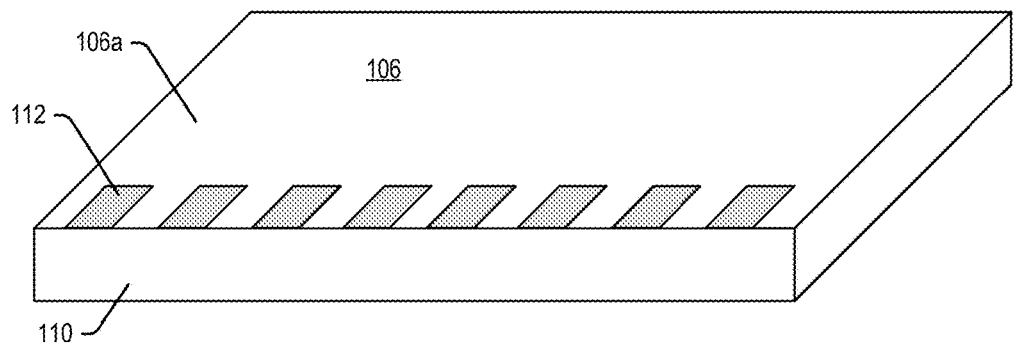
FIG. 6 is a front perspective view of a single semiconductor die from the wafer showing the die bond pads extended to what will be an edge of the semiconductor die upon dicing the semiconductor die from the wafer.

In step 204, the semiconductor wafer 100 may be cut from an ingot and polished on both the first major surface 102 (FIG. 4), and second major surface 104 (FIG. 7) opposite surface 102, to provide smooth surfaces. In step 206, the first major surface 102 may undergo various processing steps to divide the wafer 100 into respective semiconductor die 106 (one of which is shown in FIG. 4), and to form integrated circuits of the respective semiconductor die 106 on and in the first major surface 102. These various processing steps may include metallization steps depositing metal contacts for transferring signals to and from the integrated circuits. The electrical contacts may include die bond pads 108 (one of which is numbered in each of FIGS. 4 and 5) exposed on the first major surface 102. The number of bond pads 108 shown is for simplicity and each die 105 may include many more die bond pads than are shown. In embodiments, the die bond pads 108 may be formed of aluminum, or alloys thereof, but the pads 108 may be formed of other materials in further embodiments. In embodiments, the integrated circuits may operate as NAND flash memory semiconductor die, though other types of integrated circuits are contemplated.

After dicing as explained below, a number of semiconductor die 106 may be stacked and electrically connected to a medium such as a PCB along an edge 110 (FIG. 5), referred to herein as the active edge 110. The active edge may be formed at a nonzero angle, typically at or about 90°, relative to first major surface. In order to allow electrical connection at the active edge, the die bond pads 108 may be extended or otherwise formed at the active edge 110 in step 208. In one embodiment, the die bond pads 108 may be extended to and terminate at the active edge 110 of each semiconductor die 106 by a redistribution layer having electrical traces 112 (FIG. 6) of Nickel and Gold extending from each die bond pad 108 to the active edge 110.

In one example, the traces 112 may be formed by first applying a passivation layer of dielectric material over the first major surface 102 of the wafer 100. The passivation layer may then be etched in a photolithographic process to expose each of the die bond pads 108. Various metal layers may then be applied over the passivation layer, for example by sputtering or other thin film deposition processes. The metal layers may for example include Titanium, Copper, Nickel and Gold. It is understood that less than all of these metal layers may be used, or that other or additional metal layers may be used, in further embodiments. The metal layers may then be photolithographically processed and etched to define the traces 112 extending from the die bond pads 108 to the active edge 110 of each semiconductor die. The traces 112 may extend straight out from the bond pads 108 (perpendicular to the row of bond pads 108). However, the traces may redistribute the bond pads 108 to the active edge 110 in patterns that do not extend straight out from the bond pads in further embodiments.

It is understood that the traces 112 extending from the die bond pads 108 to the active edge 110 may be formed of other materials and by other processes in further embodiments. Additionally, when the traces 112 are formed, the die are not yet diced from the wafer and the active edges 110 of the respective die do not yet exist. The traces 112 are formed on the wafer to extend from the die bond pads 108 a distance such that, when the die are diced from the wafer, the cutting mechanism (explained below) will sever the traces 112 along their length to leave an end of the traces 112 exposed at the active edge 110. It is understood that the traces 112 may in fact terminate near, but not quite at, the active edge 110, provided that the traces 112 terminate near enough to the active edge so as to connect with a solder ball on the PCB during a reflow process as explained below.

In a further embodiment, the traces 112 may be omitted entirely. In such an embodiment, the cutting mechanism may sever the die bond pads themselves to leave a portion of the die bond pads exposed at the active edge 110.

In step 212, the wafer may undergo a backgrind process against the second major surface 104 to thin the wafer from, for example, about 775 microns (μm) to a range of about 25 μm to 100 μm. It is understood that the wafer 100 may be thinner or thicker than this range after the backgrind step in further embodiments.

Figure 7:
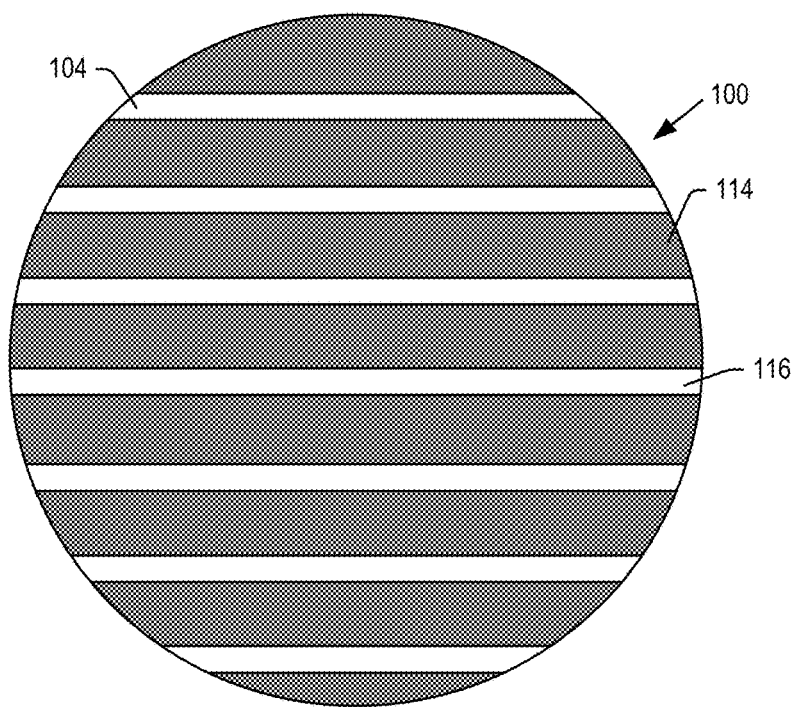
FIG. 7 is a rear view of a semiconductor wafer showing a second major surface of the wafer including a DAF layer.
Figure 8:
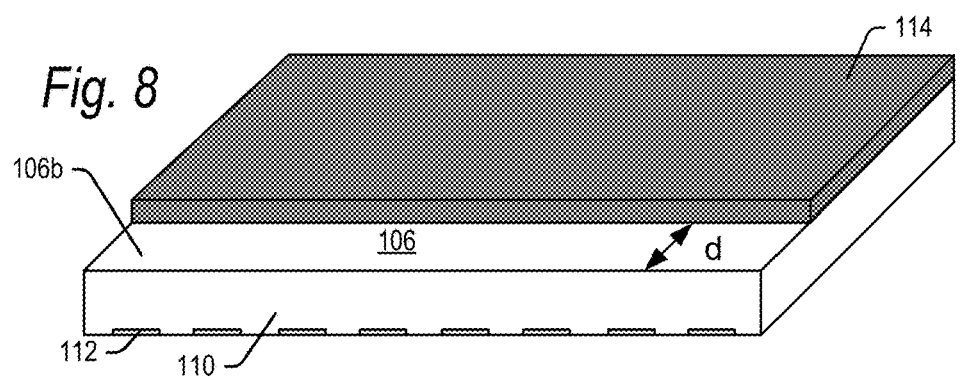
FIG. 8 is a rear perspective view of a single semiconductor die from the wafer including a DAF layer.
Figure 9:
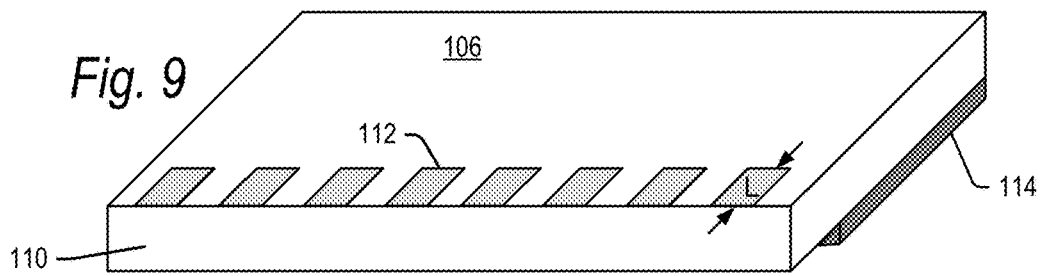
FIG. 9 is a front perspective view of a single semiconductor die from the wafer including a DAF layer.

In a step 214, a layer of die attach film (DAF) 114 may be applied to the second major surface 104 of wafer 100 as shown in FIGS. 7-9. In accordance with an aspect of the present technology, the DAF 114 may be applied to the wafer 100 in a striped pattern as shown in FIG. 7 separated by bare spaces 116 having no DAF 114. The DAF 114 is applied or processed in a controlled manner so that the bare spaces 116 on the second major surface 104 of wafer 100 align with the traces 112 on the first major surface 102 of the wafer 100. As explained hereinafter, after the semiconductor die 106 are diced, they may be stacked together with the DAF 114 on the second major surface 104 of one die 106 lying against the first major surface 102 of the next die 106. The bare spaces 116 in the DAF 114 are provided so that the DAF 114 of one die does not cover the traces 112 of the next adjacent die.

As shown in FIGS. 8 and 9, the bare spaces 116 may be provided so that, when the semiconductor die 106 are diced from the wafer 100, each die has a bare space of distance, d, from the active edge 110 which is devoid of DAF 114. The distance, d, is at least as great as a length, L, of the traces 112. It is conceivable that the distance, d, be less than the length, L, in further embodiments, provided that a sufficient portion of the traces 112 are left exposed for connection to the PCB as explained below.

The DAF 114 may be applied over the entire second major surface 104, and then selectively removed to define the bare spaces 116 in the proper locations. In further embodiments, the DAF 114 may be applied in stripes which define the bare spaces 116. As one example, the DAF 114 may be 8988UV epoxy from Henkel Corp., having offices in California, USA.

The DAF 114 may have a thickness of 3 μm to 30 μm, though it may be thinner or thicker than that in further embodiments. As explained below, a block of stacked semiconductor die (spaced apart from each other by the thickness of DAF 114) may be mounted on a PCB so that the traces 112 on each die align with solder balls provided on the PCB. The thickness of the DAF 114 defines the spacing between the semiconductor die in the stack and the DAF thickness may be provided to ensure that the spacing between each die matches the spacing of each row of solder balls. In the above description, the traces 112 were formed prior to application of the DAF 114. It is understood that these steps may be switched in further embodiments.

The semiconductor die 106 may next be diced from the wafer 100 in step 216. In one embodiment, the wafer 100 may be diced using a stealth lasing process. The wafer 100 may be supported on a chuck or other support surface (not shown) with the integrated circuits on the first major surface 102 facing the support surface and the second major surface 104 facing way from the support surface. A laser may then emit a pulsed laser beam at a wavelength that transmits through the second major surface 104 of the wafer 100, for example at infrared or near-infrared wavelengths. The pulsed laser beam may be focused to a point beneath the wafer's surface 104 using an optical system, for example including one or more collimating lenses. When the laser beam hits a peak power density at the focal point, the wafer absorbs the energy, and a pinpoint hole is created beneath the wafer's surface.

The laser may be moved along scribe lines of the wafer 100 and activated at a number of points so that a number of closely situated pinpoint holes are formed at an intermediate depth of the wafer (between the first and second major surfaces 102, 104 of the wafer). The rows and columns of pinpoint holes define the eventual shape of each semiconductor die 106 to be diced from wafer 100. The laser may form a single layer of pinpoint holes at a single depth, or multiple (two or more) layers of pinpoint holes at multiple depths.

The pinpoint holes may generate cracks in the wafer which propagate toward the first and second major surfaces 102, 104 to complete the dicing of the wafer. In further embodiments, additional mechanical stresses may be induced in the wafer after the laser creates the pinpoint holes to facilitate propagation of the pinpoint hole cracks. For example, after the lasing process, the wafer may be flipped over and the second major surface 104 secured on a tape. The tape may then be stretched along orthogonal axes. This generates stresses within the wafer which cause cracks at the pinpoint holes to propagate to the first and second major surfaces 102, 104 of the wafer 100 to complete the dicing of the wafer 100. The stretching also spreads the diced semiconductor die 106 on the tape. A pick and place robot may transfer the diced semiconductor die 106 to a support surface for further processing as explained below. Alternatively, after dicing, the pick and place robot may transfer the semiconductor die directly onto the PCB as explained below.

The stealth lasing and subsequent propagation of the cracks may cause dicing of the wafer 100 along lines through the traces 112 (or through the die bond pads 108 in embodiments not having traces 112). Specifically, the laser is applied along lines intersecting the traces 112 or die bonds pads 108 so that the traces or bond pads are severed at the active edge 110 as the cracks propagate to the first major surface 102. Thus, as shown in the in view of a diced semiconductor die 106 in FIG. 9, the traces 112 terminate at the active edge 110 of each semiconductor die. The wafer 100 may be diced by techniques other than stealth lasing in further embodiments. Such additional dicing techniques include blade cutting and waterjet cutting.

Figure 10:
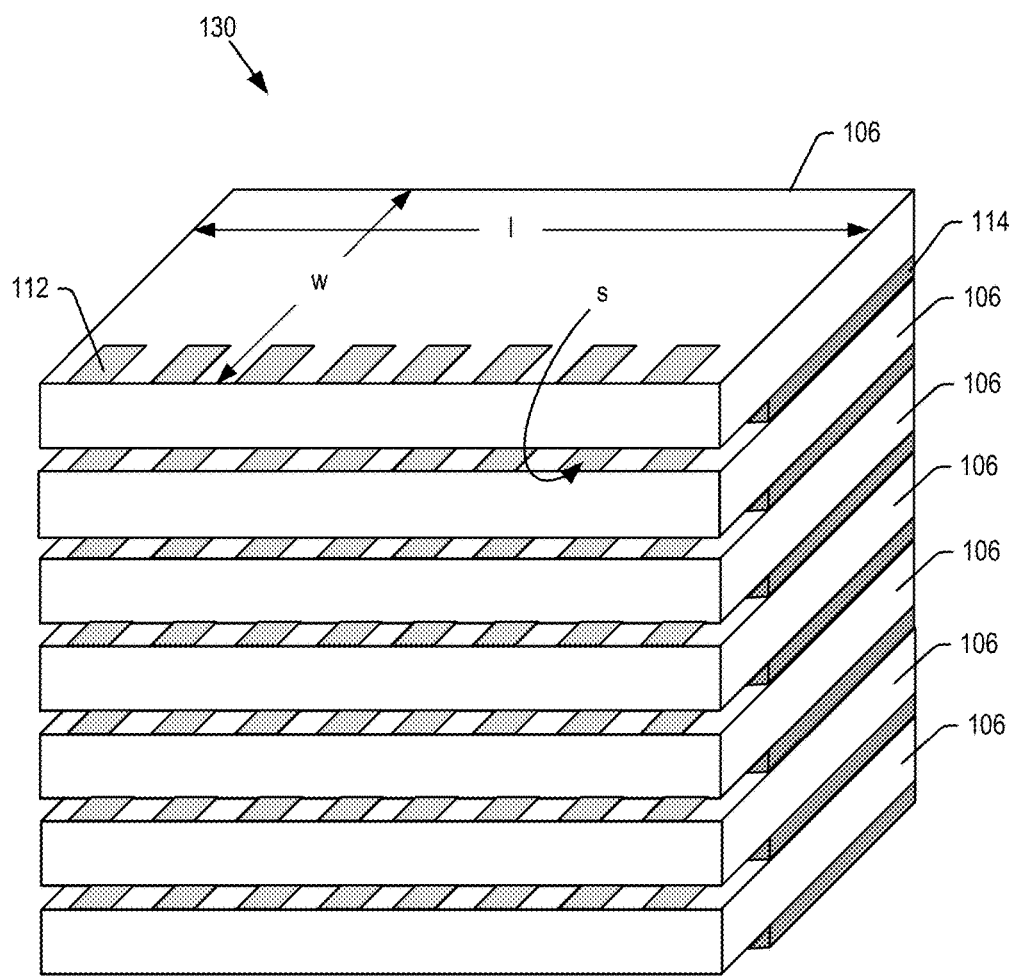
FIG. 10 is a perspective view of a stack of semiconductor die diced from the wafer.

A plurality of wafers 100 may be fabricated according to steps 200-216 explained above. Thereafter, a pick and place robot may take semiconductor die 106 from the same wafer or different wafers and stack them into a stacked block 130 of semiconductor die 106 in step 218 as shown in FIG. 10. The stacked block 130 may also be referred to herein as a semiconductor device 130. The die 106 may be stacked horizontally into the block 130. That is, the DAF 114 of a first die may be supported on a horizontal, x-y plane of an intermediate support table 132, and the rest of the die 106 in the block 130 may be stacked horizontally upwards thereon in the z-direction. Each die may be separated from each other by the thickness of the DAF 114 as shown in FIG. 10. The active edges 110 at which the traces 112 terminate may be aligned along a common side of the stacked block 130.

The number of semiconductor die 106 in a single stacked block 130 may vary in embodiments, including for example 2, 4, 8, 16, 32, 64 or 128 semiconductor die. There may be more or other numbers of semiconductor die in a stacked block 130 in further embodiments.

Figure 11:
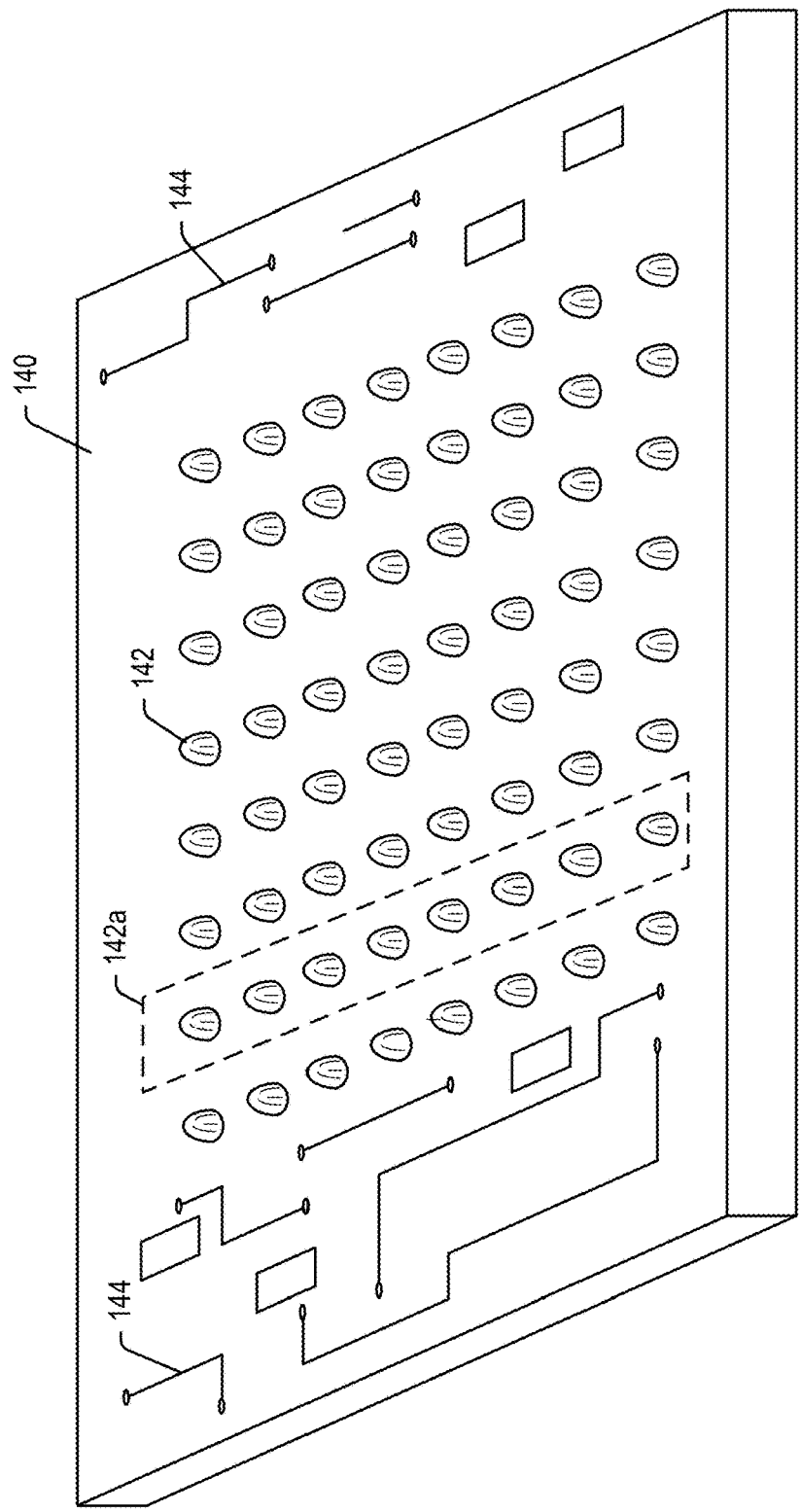
FIG. 11 is a perspective view of a printed circuit board on which the stack of semiconductor die may be arranged.

In embodiments, once the stacked block 130 is formed, it may be transferred as a block onto a medium, such as PCB 140 shown in FIG. 11. The PCB 140 may for example be a high density interconnect (HDI) PCB. Other PCBs and other mediums such as substrates are possible in further embodiments. The PCB 140 may include a pattern of fine pitch solder balls 142. The pattern of solder balls is arranged in a number of rows (one row designated as 142a. In embodiments, there are at least as many rows 142a of solder balls (in the y-direction) as there are die in the block 130. Within each row 142a, there are at least as many solder balls (in the x-direction) as there are traces 112 on a die 106 in the block 130. The solder balls 142 may be applied to the PCB 140 in the desired pattern using a variety of technologies, including for example stud bumping. The PCB 140 may further include electrical conductors 144 for transferring signals and other voltages to/from the solder balls 142. The pattern of electrical conductors 144 shown is by way of example only and may vary in further embodiments.

While solder balls are shown in FIG. 11, it is understood that solder paste or other conductive contacts may be used instead of solder balls in further embodiments. The conductive contacts may extend above a surface of the PCB 140 sufficiently to adhere to the traces 112 upon reflow of the conductive contacts.

Figure 12:
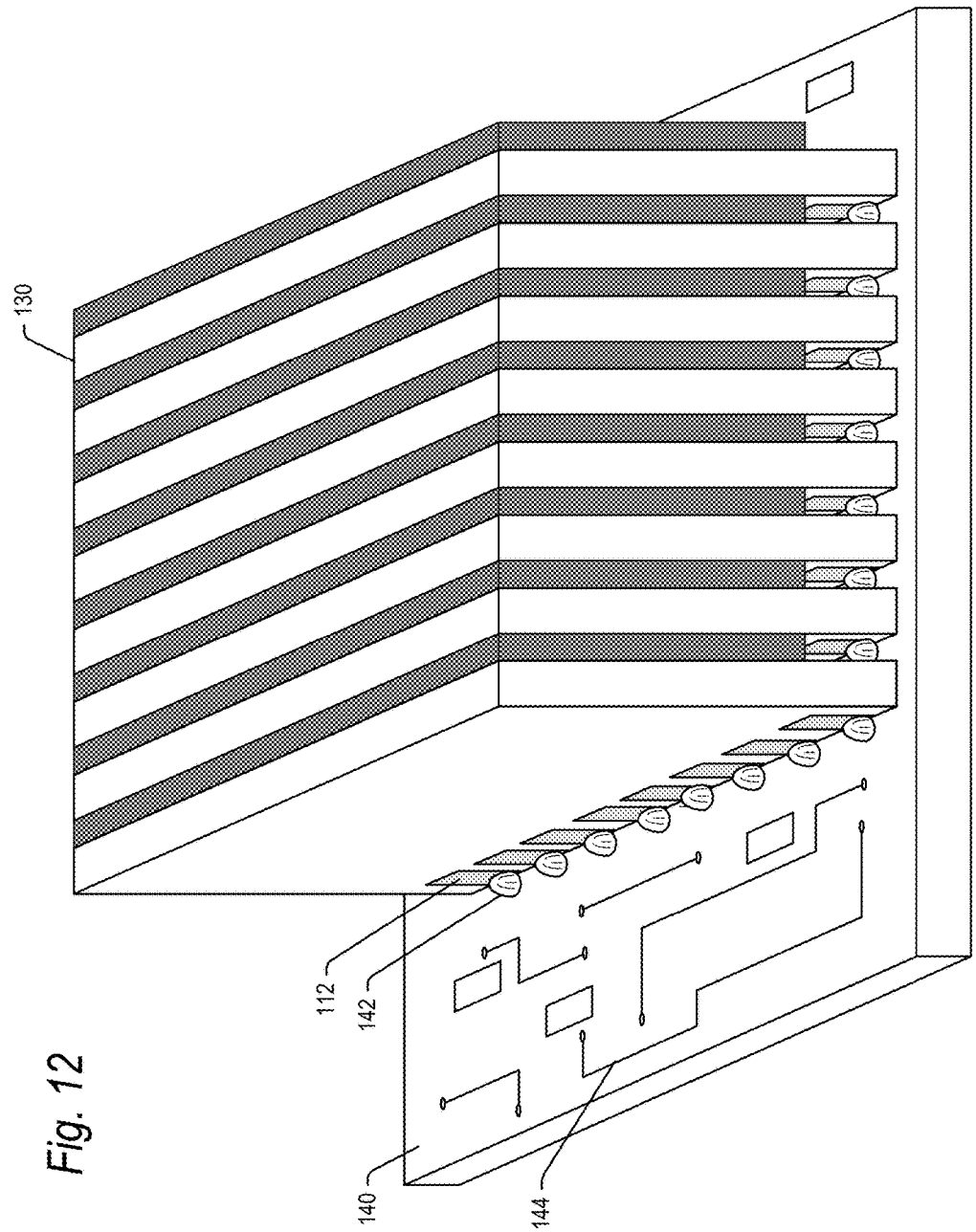
FIG. 12 is a perspective view of a printed circuit board on which the stack of semiconductor die are vertically arranged.
Figure 13:
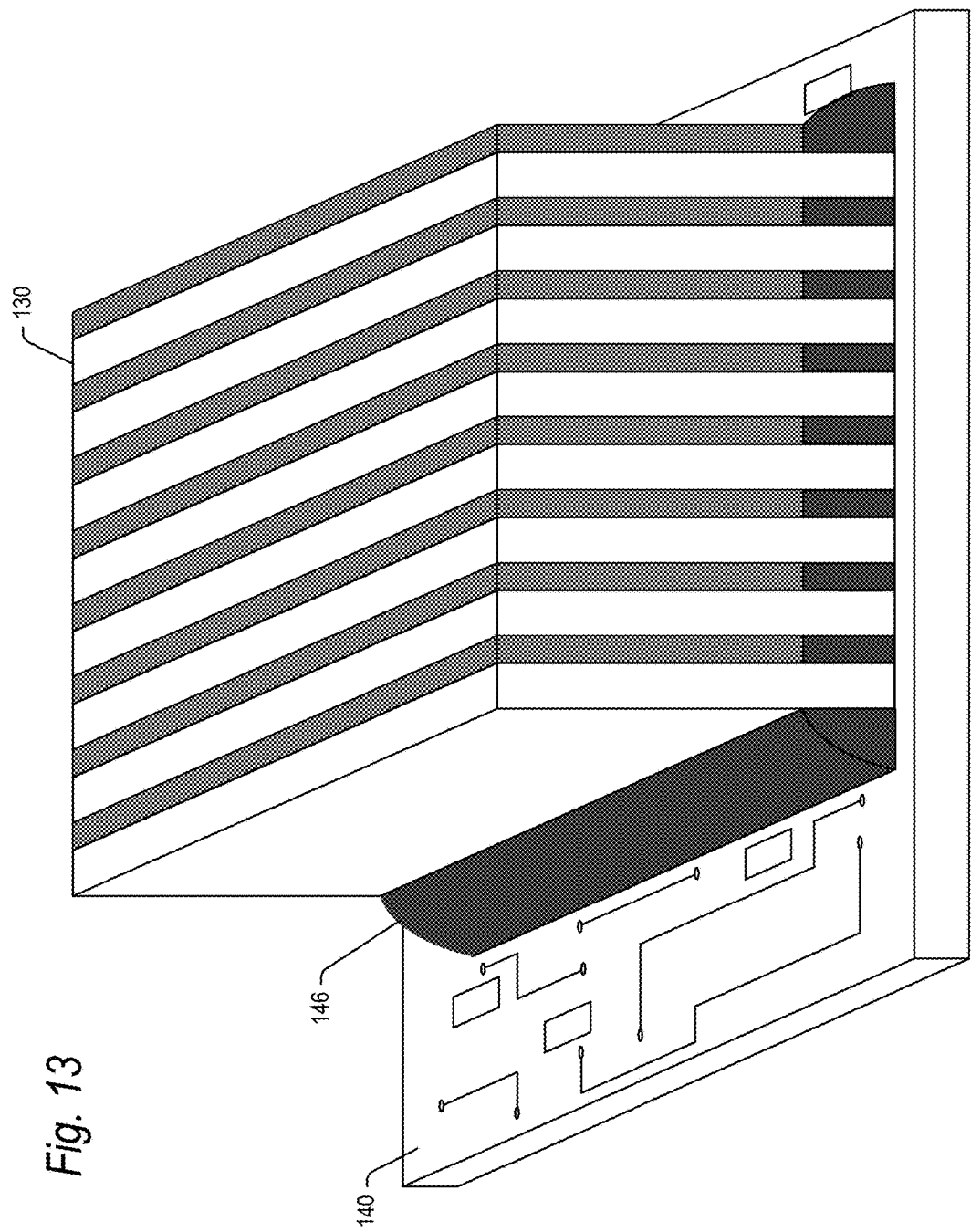
FIG. 13 is a perspective view of a printed circuit board on which the stack of semiconductor die are arranged with a resin under-filling gaps in the stack of semiconductor die.

The semiconductor device 130 may be surface mounted vertically on the PCB 140 in step 222 as shown in FIG. 12. That is, the device 130 may be surface mounted with the active edges 110 and ends of traces 112 of each semiconductor die 106 in device 130 resting against (or very close to) the PCB 140. The major surfaces 106a (FIGS. 6) and 106b (FIG. 8) of the die 106 in the device 130 reside in x-z planes perpendicular to a surface of the PCB 140 in the x-y plane. (It is understood that the x-y-z axes are provided for ease of understanding and the die and PCB may reside in other planes in further embodiments).

As noted, the spacing between the rows 142a of solder balls 142 in the y-direction matches the spacing between the traces 112 in each of the semiconductor die 106 in the device 130. The solder balls may in fact center the respective die 106 in the device 130 on the rows of solder balls 142 in the y-direction when the device 130 is lowered onto the PCB 140. As noted above, the spacing between each semiconductor die 106 in the device 130 may be 3 μm to 30 μm, though the spacing may be more or less than this in further embodiments.

The spacing between the solder balls 142 in each row 142a in the x-direction also matches the spacing between the traces 112 on each die 106 in the device 130. As noted, the number of traces 112, and the corresponding number of solder balls 142, is shown by way of example and there may be less or (likely) many more traces 112 and solder balls 142 in a row of solder balls. Thus, once lowered onto the PCB and positioned, each trace 112 on each die 106 in the semiconductor device 130 may be aligned with and rest against a solder ball 142.

In the above-described embodiment, the semiconductor die 106 are assembled into a block 130, and then mounted as a block 130 on the PCB 140, between each row of solder balls 142. In further embodiments, a first individual semiconductor die 106 may be placed vertically on the PCB 140, with its active edge 110 against the PCB 140. A second semiconductor die 106 may then be stacked vertically against the first semiconductor die with its active edge 110 on the PCB 140. And then a third semiconductor die may be stacked vertically on the PBC against the second semiconductor die, and so on until all semiconductor die in the block 130 are vertically stacked on the PCB 140. The semiconductor die 106 may also be assembled together in sub-blocks (e.g., of four or eight die), with sub-blocks being mounted in successive steps onto the PCB 140 until the full block 130 is completed.

In step 226, the semiconductor device 130 and PCB 140 may be heated to reflow the solder balls against each of the traces 112 to melt the solder balls against, and in good electrical contact with, each of the traces 112. Surface adhesion and wicking will ensure a good contact with the solder balls against the traces 112 as the solder balls melt, reflow and then harden against the traces 112. However, in further embodiments, a support arm (not shown) may exert a light force against the block 130 in the direction of arrow A to support the block 130 during reflow and to push the traces 112 against the solder balls 142.

Fabrication of the semiconductor device 130 on the PCB 140 may be completed after the reflow process of step 226. However, in further embodiments, an epoxy or other resin or polymer 146 (FIG. 13) may be applied to the traces 112 on the uncovered (front) die in the device 130, and injected into the spaces between the PCB 140 and DAF 114 on the interior die, in an under-fill step 230. The polymer 146 may be applied as a liquid which then hardens into a solid layer. This under-fill step protects the electrical connections at each of the traces 112, and further secures the semiconductor device 130 onto the PCB 140. Various polymers may be used as polymer 146, but in embodiments, it may be Hysol epoxy resin from Henkel Corp., having offices in California, USA.

After the under-fill step 230, the semiconductor device 130 on the PCB 140 may undergo final stage testing in a step 232. One such test may be a drop test, where the device 130 and PCB 140 are dropped from a height, and then tested for operation. Another such test may be a thermal cycling test where the device 130 and PCB 140 are cycled between a high temp (e.g., 85° C. or 125° C.) to a low temp (−40° C.) for up to 1000 times, and then tested for operation. Other tests may be performed. In the final stage testing, the under-fill polymer 146 may protect the device 130 against shock from the drop test, and stresses due to thermal mismatch between the die 106 and PCB 114 during the thermal cycling test.

Similarly, the die 106 may be tested at earlier stages in the fabrication process, before and/or after being assembled into the block 130, and before and/or after reflow. If a semiconductor die is identified which is defective and non-functional, that die can be excluded from the operation of the semiconductor device 130 by system level programming of the semiconductor device 130.

The vertical semiconductor device 130 and PCB 140 may together comprise an electronic component that can be implemented in a host device. The vertical semiconductor device 130 according to the present technology provides several advantages. For example, it attaches to an array of solder balls on the PCB 140 in a manner analogous to a conventional horizontal flip chip. However, where conventional horizontal flip chips are able to affix a single die to the array of solder balls, the vertical semiconductor device 130 is able to affix an entire block of vertically-oriented semiconductor die.

Additionally, the vertical semiconductor device 130 may be coupled directly to a PCB without requiring a substrate conventionally used to communicate signals between a PCB and semiconductor die. Moreover, the vertical semiconductor device 130 may be electrically coupled without using wire bonds. Wire bonds add additional costs and processing steps. Additionally, wire bonding to die in a die stack limits the number of die that can be provided in the stack, as performance issues such as noise, electrical shorting and parasitic RLC increase as the number of die in the stack increase. In the present technology, each die in the block is affixed directly to the PCB, and die may be added to the block without increasing any of the above-mentioned performance issues.

Moreover, the vertical semiconductor device 130 provides a large number of die in a minimal overall form factor. The die may be arranged in a block and coupled to the PCB without having to stagger the die within the block, or provide a spacer layer between the die, one of which configurations are otherwise needed to allow wire bond access to the bond pads. Staggering the die, or spacing the die with a spacer layer, increases the form factor of the semiconductor device. The vertical semiconductor device 130 has a minimal overall size, with the block 130 having a form factor no greater than the dimensions of the die 106 and DAF 114 together. Additionally, each die in the block is supported against another die, thereby enabling the device to withstand mechanical shock and thermal stresses better than would individual semiconductor die on a PCB or within a package.

In summary, an example of the present technology relates to a semiconductor device, comprising: a semiconductor device for being mounted to a medium, comprising: a plurality of semiconductor die, each semiconductor die comprising: a major surface, an active edge at a nonzero angle to the major surface, and electrical contacts formed in the major surface, adjacent the active edge of the semiconductor die, the plurality of semiconductor die configured to surface mount to the medium with the active edge of each semiconductor die facing the medium.

In a further example, the present technology relates to a semiconductor device, comprising: a plurality of semiconductor die, each semiconductor die comprising: a first major surface having a length, l (FIG. 10), and a width, w, a second major surface having a length and a width corresponding to the length and the width of the first major surface, an active edge extending between the first and second major surfaces, electrical contacts formed in the first major surface, adjacent the active edge of the semiconductor die and extending in the length direction, and die attach film (DAF) on the second major surface for affixing the second major surface to another surface, the DAF extending across the width of the second major surface and less than the entire length of the second major surface; the plurality of semiconductor die stacked in a block, separated by the DAF on each semiconductor die, and the DAF leaving a space, s (FIG. 10), over the electrical contacts between first and second semiconductor die adjacent to each other in the block.

In another example, the present technology relates to an electronic component, comprising: a plurality of semiconductor die, each semiconductor die comprising: a first major surface, a second major surface, an active edge extending between the first and second major surfaces, and electrical contacts formed in the first major surface, adjacent the active edge of the semiconductor die; and a medium comprising a plurality of conductive contacts extending above a surface of the medium, the plurality of semiconductor die surface mounted to the medium with the active edges of the plurality of semiconductor die facing the medium, and the plurality of electrical contacts electrically coupled to the plurality of conductive contacts.

In another example, the present technology relates to an electronic component, comprising: electronic component, comprising: a plurality of semiconductor die, each semiconductor die comprising: a first major surface, a second major surface, an active edge extending between the first and second major surfaces, and electrical contacts means formed in the first major surface, adjacent the active edge of the semiconductor die; and printed circuit board means comprising a plurality of conductive contact means extending above a surface of the printed circuit board means, the plurality of semiconductor die surface mounted to the printed circuit board means with the active edges of the plurality of semiconductor die facing the printed circuit board means, and the plurality of electrical contact means electrically coupled to the plurality of conductive contact means.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

We claim:

1. A semiconductor device for being mounted to a medium, comprising:
   a plurality of semiconductor die, each semiconductor die comprising:
   a first major surface,
   a second major surface comprising a die attach film (DAF) applied to the plurality of semiconductor die during fabrication of the plurality of semiconductor die on one or more wafers:
   an active edge at a nonzero angle to the first and second major surfaces, and
   electrical contacts formed in the first major surface, adjacent the active edge of the semiconductor die,
   the plurality of semiconductor die configured to surface mount to the medium with the active edge of each semiconductor die facing the medium.

2. The semiconductor device of claim 1, wherein the plurality of semiconductor die are stacked in a block, with each die separated from each other by the DAF.

3. The semiconductor device of claim 2, wherein the DAF of a first semiconductor die in the block lies against the major surface of a second semiconductor die in the block, the DAF of the first semiconductor die not contacting the electrical contacts of the second semiconductor die.

4. The semiconductor device of claim 2, wherein the DAF of a first semiconductor die in the block lies against the major surface of a second semiconductor die in the block, the DAF of the first semiconductor die formed in a way so that the first semiconductor die is devoid of DAF near the active edge of the first semiconductor die so that a space is defined between the first and second semiconductor die in an area of the electrical contacts.

5. The semiconductor device of claim 1, wherein the electrical contacts comprise die bond pads in the major surfaces of the plurality of semiconductor die.

6. The semiconductor device of claim 1, wherein the electrical contacts comprise die bond pads in the major surfaces of the plurality of semiconductor die and electrical traces formed on the die bond pads.

7. A semiconductor device, comprising:
   a plurality of semiconductor die, each semiconductor die comprising:
   a first major surface having a length and a width,
   a second major surface having a length and a width corresponding to the length and the width of the first major surface,
   an active edge extending between the first and second major surfaces,
   electrical contacts formed in the first major surface, adjacent the active edge of the semiconductor die and extending across the first major surface in the length direction, and
   die attach film (DAF) formed on the second major surface during die fabrication for affixing the second major surface to another surface;
   the plurality of semiconductor die stacked in a block, separated by the DAF on each semiconductor die, and the block configured to be mounted directly against a medium.

8. The semiconductor device of claim 7, wherein the electrical contacts comprise die bond pads in the major surfaces of the plurality of semiconductor die.

9. The semiconductor device of claim 7, wherein the electrical contacts comprise die bond pads in the major surfaces of the plurality of semiconductor die and electrical traces formed on the die bond pads.

10. An electronic component, comprising:
    a plurality of semiconductor die, each semiconductor die comprising:
    a first major surface,
    a second major surface comprising a die attach film (DAF) applied during die fabrication,
    an active edge extending between the first and second major surfaces, and
    electrical contacts formed in the first major surface, adjacent the active edge of the semiconductor die; and
    a medium comprising a plurality of conductive contacts extending above a surface of the medium, the plurality of semiconductor die surface mounted directly to a surface of the medium with the active edges of the plurality of semiconductor die facing the medium, and the plurality of electrical contacts electrically coupled to the plurality of conductive contacts.

11. The electronic component of claim 10, wherein the plurality of semiconductor die are stacked in a block, with each die separated from each other by the DAF.

12. The electronic component of claim 11, wherein the DAF on the second major surface of a first semiconductor die in the block lies against the first major surface of a second semiconductor die in the block, the DAF of the first semiconductor die formed in a way so that the first semiconductor die is devoid of DAF near the active edge of the first semiconductor die so that a space is defined between the first and second semiconductor die in an area of the electrical contacts.

13. The electronic component of claim 10, wherein the electrical contacts comprise die bond pads in the first major surfaces of the plurality of semiconductor die.

14. The electronic component of claim 10, wherein the electrical contacts comprise die bond pads in the first major surfaces of the plurality of semiconductor die and electrical traces formed on the die bond pads.

15. The electronic component of claim 10, wherein the conductive contacts comprise solder balls.

\* \* \* \* \*